(12) United States Patent
Chun et al.

(10) Patent No.: US 9,433,117 B1
(45) Date of Patent: Aug. 30, 2016

(54) SHIELD LID INTERCONNECT PACKAGE AND METHOD

(75) Inventors: Jong Ok Chun, Chandler, AZ (US);
Nozad Karim, Chandler, AZ (US);
Richard Chen, Phoenix, AZ (US);
Giuseppe Selli, Chandler, AZ (US);
Michael Kelly, Queen Creek, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 13/475,469

(22) Filed: May 18, 2012

Related U.S. Application Data

(63) Continuation of application No. 12/708,033, filed on Feb. 18, 2010, now Pat. No. 8,199,518.

(51) Int. Cl.
*H05K 7/10* (2006.01)
*H05K 1/02* (2006.01)

(52) U.S. Cl.
CPC .............. *H05K 7/10* (2013.01); *H05K 1/0218* (2013.01)

(58) Field of Classification Search
CPC .... H05K 1/0218; H05K 1/0219; H05K 1/11;
H05K 1/115; H05K 3/36; H05K 3/40;
H05K 9/0024
USPC ........................................................ 361/767
See application file for complete search history.

(56) References Cited

U.S. PATENT DOCUMENTS

| | | |
|---|---|---|
| 4,925,024 A | 5/1990 | Ellenberger et al. |
| 5,166,772 A | 11/1992 | Soldner et al. |
| 5,416,358 A | 5/1995 | Ochi et al. |
| 5,468,999 A | 11/1995 | Lin et al. |
| 5,473,191 A | 12/1995 | Tanaka |
| 5,557,142 A | 9/1996 | Gilmore et al. |
| 5,614,694 A | 3/1997 | Gorenz, Jr. et al. |
| 5,639,989 A | 6/1997 | Higgins, III |

(Continued)

FOREIGN PATENT DOCUMENTS

| | | |
|---|---|---|
| KR | 10-0645755 | 11/2000 |
| KR | 10-1025408 | 12/2008 |

OTHER PUBLICATIONS

Adlam et al., "A Semiconductor Device Having RF Shielding and Method Therefor", U.S. Appl. No. 11/942,254, filed Nov. 19, 2007.

(Continued)

*Primary Examiner* — Tremesha S Willis
(74) *Attorney, Agent, or Firm* — McAndrews, Held & Malloy, Ltd.

(57) ABSTRACT

An electronic component package includes a substrate and an electronic component mounted to the substrate, the electronic component including a bond pad. A first antenna terminal is electrically connected to the bond pad, the first antenna terminal being electrically connected to a second antenna terminal of the substrate. A package body encloses the electronic component, the package body having a principal surface. An antenna is formed on the principal surface by applying an electrically conductive coating. An embedded interconnect extends through the package body between the substrate and the principal surface and electrically connects the second antenna terminal to the antenna. Applying an electrically conductive coating to form the antenna is relatively simple thus minimizing the overall package manufacturing cost. Further, the antenna is relatively thin thus minimizing the overall package size.

24 Claims, 16 Drawing Sheets

(56) References Cited

U.S. PATENT DOCUMENTS

| | | | |
|---|---|---|---|
| 5,656,864 A | 8/1997 | Mitsue et al. | |
| 5,694,300 A | 12/1997 | Mattei et al. | |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,528,876 B2 | 3/2003 | Huang | |
| 6,602,737 B2 | 8/2003 | Wu | |
| 6,686,649 B1 | 2/2004 | Mathews et al. | |
| 7,030,469 B2 | 4/2006 | Mahadevan et al. | |
| 7,049,682 B1 | 5/2006 | Mathews et al. | |
| 7,071,550 B2 | 7/2006 | Sato | |
| 7,183,498 B2 | 2/2007 | Ogura et al. | |
| 7,342,303 B1 | 3/2008 | Berry et al. | |
| 7,629,674 B1 | 12/2009 | Foster | |
| 7,633,765 B1 | 12/2009 | Scanlan et al. | |
| 7,659,604 B2 | 2/2010 | Fujiwara et al. | |
| 7,745,910 B1 | 6/2010 | Olson et al. | |
| 7,851,894 B1 | 12/2010 | Scanlan | |
| 7,855,462 B2 * | 12/2010 | Boon et al. | 257/784 |
| 7,868,462 B2 | 1/2011 | Choi et al. | |
| 7,888,183 B2 | 2/2011 | Liu et al. | |
| 7,898,066 B1 | 3/2011 | Scanlan et al. | |
| 7,960,818 B1 | 6/2011 | Davis et al. | |
| 8,008,753 B1 | 8/2011 | Bolognia | |
| 8,012,868 B1 | 9/2011 | Naval et al. | |
| 8,030,722 B1 | 10/2011 | Bolognia et al. | |
| 8,093,691 B1 | 1/2012 | Fuentes et al. | |
| 8,247,889 B2 | 8/2012 | Liao et al. | |
| 8,536,462 B1 * | 9/2013 | Darveaux et al. | 174/260 |
| 8,614,899 B2 | 12/2013 | Madsen et al. | |
| 8,872,312 B2 | 10/2014 | Wang et al. | |
| 8,897,028 B2 | 11/2014 | Takemura | |
| 9,055,682 B2 | 6/2015 | Mugiya et al. | |
| 9,070,793 B2 | 6/2015 | Liao et al. | |
| 2002/0089832 A1 | 7/2002 | Huang | |
| 2003/0057545 A1 | 3/2003 | Shim et al. | |
| 2003/0067757 A1 | 4/2003 | Richardson et al. | |
| 2005/0073038 A1 | 4/2005 | Kuo et al. | |
| 2005/0280139 A1 | 12/2005 | Zhao et al. | |
| 2006/0208347 A1 | 9/2006 | Kim | |
| 2007/0030661 A1 | 2/2007 | Morris et al. | |
| 2007/0163802 A1 * | 7/2007 | Monthei | 174/350 |
| 2009/0146268 A1 | 6/2009 | Huang et al. | |
| 2010/0101841 A1 * | 4/2010 | Fan | 174/257 |
| 2010/0289716 A1 | 11/2010 | Lenzi et al. | |
| 2012/0008288 A1 | 1/2012 | Tsukamoto et al. | |
| 2012/0044653 A1 | 2/2012 | Morris et al. | |
| 2014/0016293 A1 | 1/2014 | Song | |
| 2015/0036296 A1 | 2/2015 | Chen et al. | |
| 2015/0043172 A1 | 2/2015 | Mugiya et al. | |
| 2015/0049439 A1 | 2/2015 | Shimamura et al. | |
| 2015/0070849 A1 | 3/2015 | Shimamura et al. | |

OTHER PUBLICATIONS

Berry et al., "A Semiconductor Device Having RF Shielding and Method Therefor", U.S. Appl. No. 11/971,577, filed Jan. 9, 2008.

Yoshida et al., "Stackable Protruding Via Package and Method", U.S. Appl. No. 12/474,009, filed May 28, 2009.

Yoshida et al., "Stackable Via Package and Method", U.S. Appl. No. 12/483,913, filed Jun. 12, 2009.

Foster, "Shielded Package Having Shield Lid", U.S. Appl. No. 12/589,500, filed Oct. 23, 2009.

Darveaux, "Flex Circuit Package and Method", U.S. Appl. No. 12/692,397, filed Jan. 22, 2010.

Chun et al., "Top Feature Package and Method", U.S. Appl. No. 12/708,033, filed Feb. 18, 2010.

Fuentes et al., "Shielded Electronic Component Package and Method", U.S. Appl. No. 12/779,784, filed May 13, 2010.

* cited by examiner

SHIELD LID INTERCONNECT PACKAGE AND METHOD

RELATED APPLICATIONS

This application is a continuation of Chun et al., U.S. patent application Ser. No. 12/708,033, filed on Feb. 18, 2010, entitled "TOP FEATURE PACKAGE AND METHOD," now U.S. Pat. No. 8,199,518, issued Jun. 12, 2012, which is herein incorporated by reference in its entirety.

BACKGROUND OF THE INVENTION

1. Field of the Invention

The present application relates to the field of electronics, and more particularly, to methods of forming electronic component packages and related structures.

2. Description of the Related Art

A wireless electronic component package is used to send and receive electromagnetic radiation, sometimes called wireless signals. An antenna is used to propagate the wireless signals from/to the wireless electronic component package.

Generally, a discrete antenna, i.e., a separate piece, is mounted to form the wireless electronic component package. However, the antenna mounting requires special tooling and additional assembly operations thus increasing the overall cost of the wireless electronic component package. Further, space must be allocated for the antenna thus restricting the ability to miniaturize the wireless electronic component package.

SUMMARY OF THE INVENTION

An electronic component package includes a substrate and an electronic component mounted to the substrate, the electronic component including a bond pad. A first antenna terminal is electrically connected to the bond pad, the first antenna terminal being electrically connected to a second antenna terminal of the substrate.

A package body encloses the electronic component, the package body having a principal surface. An antenna is formed on the principal surface by applying an electrically conductive coating. An embedded interconnect extends through the package body between the substrate and the principal surface and electrically connects the second antenna terminal to the antenna. Applying an electrically conductive coating to form the antenna is relatively simple thus minimizing the overall package manufacturing cost. Further, the antenna is relatively thin thus minimizing the overall package size.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
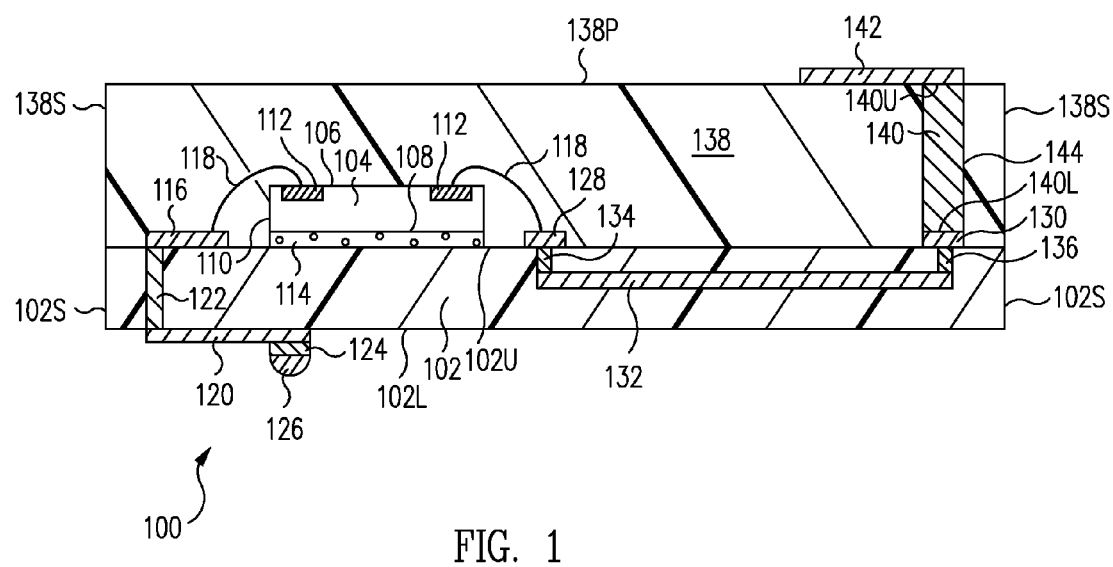
FIG. 1 is a cross-sectional view of a wireless electronic component package in accordance with one embodiment.

FIG. 1 is a cross-sectional view of a wireless electronic component package 100 in accordance with one embodiment. Wireless electronic component package 100, sometimes called an electronic component package, includes a substrate 102. Substrate 102 is a dielectric material such as laminate, ceramic, printed circuit board material, or other dielectric material.

Substrate 102 includes an upper, e.g., first, surface 102U and an opposite lower, e.g., second, surface 102L. Substrate 102 further includes sides 102S extending perpendicularly between upper surface 102U and lower surface 102L. Although the terms parallel, perpendicular, and similar terms are used herein, it is to be understood that the described features may not be exactly parallel and perpendicular, but only substantially parallel and perpendicular to within accepted manufacturing tolerances.

Wireless electronic component package 100 further includes an electronic component 104, e.g., a single die. In one embodiment, electronic component 104 is an integrated circuit chip, e.g., an active component. Electronic component 104, sometimes called a transceiver (Xcvr) chip, is capable of generating and/or receiving electromagnetic signals, e.g., radio frequency (RF) signals, in one embodiment. However, in other embodiments, electronic component 104 is a passive component such as a capacitor, resistor, or inductor. Further, in one embodiment, electronic component 104 includes two or more stacked dies.

In accordance with this embodiment, electronic component 104 is a single die and includes an active surface 106, an opposite inactive surface 108, and sides 110 extending perpendicularly between active surface 106 and inactive surface 108.

Electronic component 104 further includes bond pads 112 formed on active surface 106. Inactive surface 108 is mounted to upper surface 102U of substrate 102 with an adhesive 114.

Formed on upper surface 102U of substrate 102 are one or more electrically conductive upper, e.g., first, traces 116, e.g., formed of copper. One or more of bond pads 112 are electrically connected to one or more respective upper traces 116, e.g., bond fingers thereof, by one or more respective electrically conductive bond wires 118.

Although a bond pad configuration for electronic component 104 is set forth, in another embodiment, electronic component 104 is mounted in a flip chip configuration. In accordance with this embodiment, bond pads 112 are electrically and physically connected to upper traces 116 and to an antenna terminal 128 as discussed below by flip chip bumps, e.g., solder bumps, extending between bond pads 112 and upper traces 116/antenna terminal 128.

Formed on lower surface 102L of substrate 102 are lower, e.g., second, traces 120. Lower traces 120 are electrically connected to upper traces 116 by electrically conductive vias 122 extending through substrate 102 between upper surface 102U and lower surface 102L.

Although not illustrated in FIG. 1, in one embodiment, wireless electronic component package 100 further includes solder masks on upper and lower surface 102U, 102L that protect first portions of upper and lower traces 116, 120 while exposing second portions, e.g., terminals and/or bond fingers, of upper and lower traces 116, 120.

Formed on lower traces 120 are electrically conductive interconnection pads 124. Formed on interconnection pads 124 are electrically conductive interconnection balls 126, e.g., solder balls in a ball grid array (BGA). In another embodiment, interconnection balls 126 are not formed, e.g., to form a land grid array (LGA). Although BGA and LGA package configurations are set forth, in other embodiments, wireless electronic component package 100 is formed with other package configurations.

Although a particular electrically conductive pathway between bond pads 112 and interconnection balls 126 is described above, other electrically conductive pathways can be formed. For example, contact metallizations can be formed between the various electrical conductors.

Further, instead of straight though vias 122, in one embodiment, substrate 102 is a multilayer substrate and a plurality of vias and/or internal traces form the electrical interconnection between upper traces 116 and lower traces 120.

Wireless electronic component package 100 further includes electrically conductive antenna terminals 128, 130, sometimes called first and second antenna terminals. Antenna terminals 128, 130 are formed on upper surface 102U of substrate 102.

Antenna terminals 128, 130 are electrically connected to an internal antenna trace 132 by electrically conductive antenna vias 134, 136, respectively. Internal antenna trace 132 is formed within (internal to) substrate 102 and between, but separated from, upper surface 102U and lower surface 102L. In other embodiments, antenna trace 132 is formed on upper surface 102U or lower surface 102L of substrate 102.

Antenna terminal 128 is electrically connected by antenna via 134, sometimes called a first antenna via, to a first end of internal antenna trace 132. Similarly, antenna terminal 130 is electrically connected by antenna via 136, sometimes called a second antenna via, to a second end of internal antenna trace 132. A respective bond pad 112 is electrically connected to first antenna terminal 128 by a respective bond wire 118.

Wireless electronic component package 100 further includes a dielectric package body 138, e.g., formed of encapsulant or molding compound. Package body 138 encloses upper surface 102U of substrate 102, electronic component 104, and bond wires 118.

Package body 138 includes sides 138S and a principal surface 138P. Principal surface 138P is parallel to upper and lower surfaces 102U, 102L of substrate 102, and active and inactive surfaces 106, 108 of electronic component 104. Principal surface 138P is spaced above electronic component 104 and bond wires 118.

Sides 138S of package body 138 are parallel to and coplanar with sides 102S of substrate in accordance with this embodiment. Illustratively, wireless electronic component package 100 is formed simultaneously with a plurality of wireless electronic component packages 100 in an array. The array is singulated, e.g., by sawing or laser, resulting in sides 102S of substrate 102 being parallel to and coplanar with sides 138S of package body 138. However, wireless electronic component package 100 is formed individually in another embodiment.

In yet another embodiment, sides 138S of package body 138 are located inwards of sides 102S of substrate 102. In accordance with this embodiment, the periphery of upper surface 102U of substrate 102 is exposed and not covered by package body 138. Further, sides 138S can be angled, i.e., not perpendicular to upper surface 102U.

An electrically conductive embedded interconnect 140 extends through package body 138 between antenna terminal 130 and principal surface 138P of package body 138. Embedded interconnect 140 is electrically connected to antenna terminal 130 at a lower, e.g., first, surface 140L of embedded interconnect 140. An upper, e.g., second, surface 140U of embedded interconnect 140 is parallel to and coplanar with principal surface 138P in accordance with this embodiment. However, in other embodiments, upper surface 140U protrudes above or is recessed below principal surface 138P. Further, instead of being planar (flat) as in the view of FIG. 1, in other embodiments, upper surface 140U is non-planar, e.g., is curved in the concave or convex direction.

Formed on principal surface 138P of package body 138 is an electrically conductive antenna 142. Antenna 142 is electrically connected to embedded interconnect 140, e.g., to upper surface 140U. Generally, embedded interconnect 140 forms an interconnection through package body 138 and between antenna terminal 130 and antenna 142.

Accordingly, electromagnetic signals, e.g., RF signals, generated by electronic component 104 are propagated from bond pad 112, to bond wire 118, to antenna terminal 128, to antenna via 134, to internal antenna trace 132, to antenna via 136, to antenna terminal 130, to embedded interconnect 140, and to antenna 142. The electromagnetic signal emanates from antenna 142 as electromagnetic radiation, sometimes called a wireless signal.

To fabricate wireless electronic component package 100, in one embodiment, substrate 102 is fabricated and includes upper traces 116, lower traces 120, vias 122, pads 124, interconnection balls 126 (alternatively interconnection balls 126 can be fabricated at later stages of fabrication), antenna terminals 128, 130, internal antenna trace 132, and antenna vias 134, 136. Inactive surface 108 of electronic component 104 is mounted to upper surface 102U of substrate 102 with adhesive 114. Bond wires 118 are formed to electrically connect bond pads 112 to upper traces 116, e.g., bond fingers thereof, and to antenna terminal 128.

Package body 138 is formed to encapsulate upper surface 102U of substrate 102, electronic component 104, and bond wires 118. Illustratively, package body 138 is formed using a molding system in which wireless electronic component package 100 (absent package body 138) is placed into a mold. Mold compound is injected into the mold and then cured, e.g., cooled, to form package body 138. Wireless electronic component package 100 is removed from the mold. Any one of a number of different molding systems can be used to form package body 138 and the particular molding system used is not essential to this embodiment.

In one embodiment, to form embedded interconnect 140, a via aperture 144 is formed in package body 138. Via aperture 144 extends between principal surface 138P and antenna terminal 130 such that antenna terminal 130 is exposed through via aperture 144. Illustratively, via aperture 144 is formed using a laser-ablation process where a laser ablates, i.e., removes, a portion of package body 138 thus forming via aperture 144 although can be formed using other via aperture formation techniques. Via aperture 144 is filled with an electrically conductive material, e.g., by plating, thus forming embedded interconnect 140. Although not illustrated, embedded interconnect 140 tapers due to the laser-ablation process in one embodiment, e.g., the diameter at upper surface 140U is greater than the diameter at lower surface 140L.

For example, via aperture 144 and embedded interconnect 140 are formed using a method similar to that set forth in Yoshida et al., U.S. patent application Ser. No. 12/474,009, entitled "STACKABLE PROTRUDING VIA PACKAGE AND METHOD", filed on May 28, 2009, which is herein incorporated by reference in its entirety.

In another embodiment, prior to formation of package body 138, embedded interconnect 140 is formed on antenna terminal 130. For example, embedded interconnect 140 is a wire fence, e.g., a fence formed from wire, or just a single wire. Package body 138 is formed around and encloses embedded interconnect 140 in accordance with this embodiment. Embedded interconnect 140 is exposed at principal surface 138P.

For example, embedded interconnect 140 is formed using a method similar to that set forth in Scanlan et al., U.S. patent application Ser. No. 11/754,209, entitled "SEMICONDUCTOR DEVICE HAVING EMI SHIELDING AND METHOD THEREFOR", filed on May 25, 2007, now U.S. Pat. No. 7,898,066, issued Mar. 1, 2011, which is herein incorporated by reference in its entirety.

In yet another embodiment, to form embedded interconnect 140, an interconnection ball, e.g., a pre-attached solderball and/or non-collapsing interconnection ball, is formed on antenna terminal 130 prior to formation of package body 138. Package body 138 is formed around and encloses the interconnection ball.

In one embodiment, the interconnection ball is exposed at principal surface 138P of package body 138 and thus forms embedded interconnect 140. In another example, a via aperture is made in package body 138 to expose the interconnection ball, i.e., extending between principal surface 138P and the interconnection ball. The via aperture is filled with an electrically conductive via filling material such that the interconnection ball and the via filling material collective form embedded interconnect 140.

For example, embedded interconnect 140 is formed using a method similar to that set forth in Yoshida et al., U.S. patent application Ser. No. 12/483,913, entitled "STACK-ABLE VIA PACKAGE AND METHOD", filed on Jun. 12, 2009, now U.S. Pat. No. 8,222,538, issued Jul. 17, 2012, which is herein incorporated by reference in its entirety.

In yet another embodiment, embedded interconnect 140 is a stack of interconnection balls, e.g., a stack of solderballs and/or non-collapsing interconnection balls, formed on antenna terminal 130 prior to formation of package body 138. Package body 138 is formed around and encloses the stack of interconnection balls. The stack of interconnection balls is exposed at principal surface 138P of package body 138 to form embedded interconnection 140.

In yet another embodiment, package body 138 is formed. A via aperture is formed in package body 138 to extend between principal surface 138P and antenna terminal 130 such that antenna terminal 130 is exposed through the via aperture. Illustratively, the via aperture is formed using a laser-ablation process although can be formed using other via aperture formation techniques, e.g., mechanical drilling. The via aperture is filled with a stack of interconnection balls thus forming embedded interconnect 140.

For example, embedded interconnect 140 is formed using a method similar to that set forth in Darveaux et al., U.S. patent application Ser. No. 12/692,397, entitled "FLEX CIRCUIT PACKAGE AND METHOD", filed on Jan. 22, 2010, which is herein incorporated by reference in its entirety.

Generally, embedded interconnect 140 is formed using any one of the methods described above including: (1) forming a via aperture in package body 138, e.g., using laser-ablation and filling the via aperture; (2) forming a wire fence and enclosing the wire fence in package body 138; (3) forming an interconnection ball and enclosing the interconnection ball in package body 138 such that the interconnection ball is exposed from package body 138; (4) forming an interconnection ball, totally enclosing the interconnection ball in package body 138, forming a via aperture in package body 138 to expose the interconnection ball, and filling the via aperture; (5) forming a stack of interconnection balls and enclosing the stack within package body 138; and (6) forming a via aperture in package body 138, e.g., using laser-ablation, and filling the via aperture with a stack of interconnection balls.

After fabrication of embedded interconnect 140 using any of the techniques as set forth above, antenna 142 is formed. In one embodiment, an electrically conductive material is selectively applied to principal surface 138P to form antenna 142. Illustratively, an electrically conductive coating, e.g., electrically conductive paint such as a urethane base silver paint, is selectively sprayed and cured, e.g., dried, to form antenna 142. In another embodiment, an electrically conductive coating is non-selectively applied to package body 138 and patterned, e.g., using laser-ablation, to form antenna 142. Antenna 142 can be patterned into any one of a number of shapes, e.g., an F shape, a rectangle, two rows of interconnected rectangles, with three rectangles per row, or other shape.

Applying an electrically conductive coating to form antenna 142 is relatively simple compared to mounting a discrete antenna. Accordingly, the tooling and assembly operations required to form antenna 142 are minimized thus minimizing the overall fabrication cost of wireless electronic component package 100. Further, antenna 142 is relatively thin, e.g., has a thickness equal to a layer of conductive paint, thus minimizing the overall size of wireless electronic component package 100.

Figure 1A:
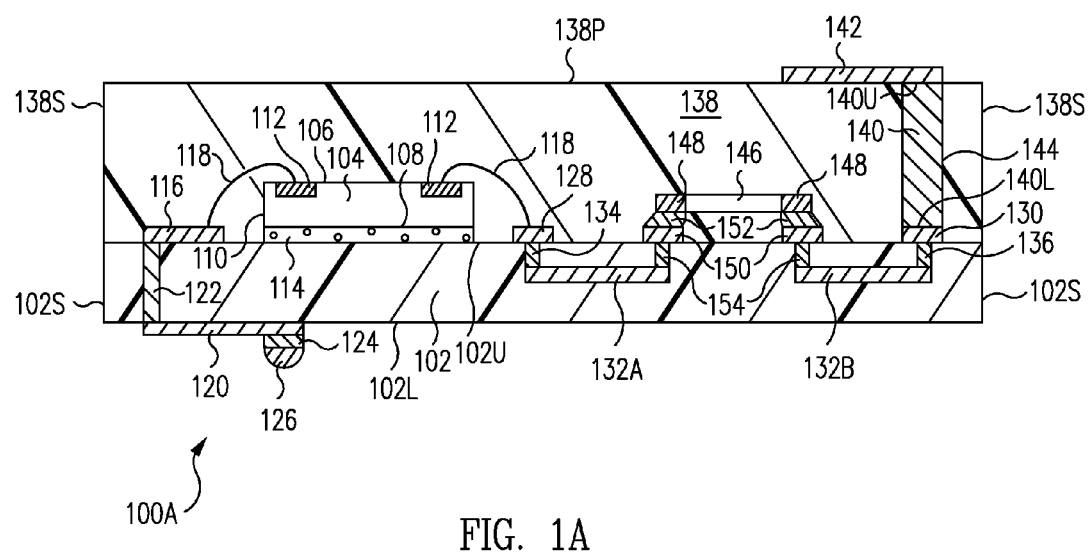
FIG. 1A is a cross-sectional view of a wireless electronic component package in accordance with one embodiment.

FIG. 1A is a cross-sectional view of a wireless electronic component package 100A in accordance with one embodiment. Wireless electronic component package 100A of FIG. 1A is substantially similar to wireless electronic component package 100 of FIG. 1 and only the significant differences between wireless electronic component package 100A and wireless electronic component package 100 are discussed below.

Referring now to FIG. 1A, in accordance with this embodiment, wireless electronic component package 100A includes a matching component 146. In one embodiment, matching component 146 matches the signals, e.g., RF signals, from electronic component 104 to the impedance of antenna 142 to control the wireless signal transmitted from antenna 142, although matching component 146 performs other functions in other embodiments.

Matching component 146 includes a single electronic component, e.g., an active or passive component, in one embodiment. In another embodiment, matching component 146 includes two or more electronic components, e.g., two or more active and/or passive components, for example, is an LC (inductor-capacitor) matching component.

Generally, matching component 146 is electrically connected between electronic component 104 and antenna terminal 130. In this specific example, matching component 146 includes contacts 148 electrically connected to matching component terminals 150 on upper surface 102U by solder joints 152. Matching component terminals 150 are electrically connected to internal traces 132A, 132B by matching component vias 154. Internal traces 132A, 132B are electrically connected to antenna vias 134, 136, respectively.

Although a surface mounting configuration for matching component 146 is illustrated and discussed, in other embodiments, matching component 146 is mounted in a flip chip, wire bond, or other configuration. Further, although a particular interconnection including contacts 148, terminals 150, solder joints 152, vias 154, traces 132A, 132B are illustrated, the interconnection is an example only, and other interconnections can be formed depending upon the particular application.

Figure 2:
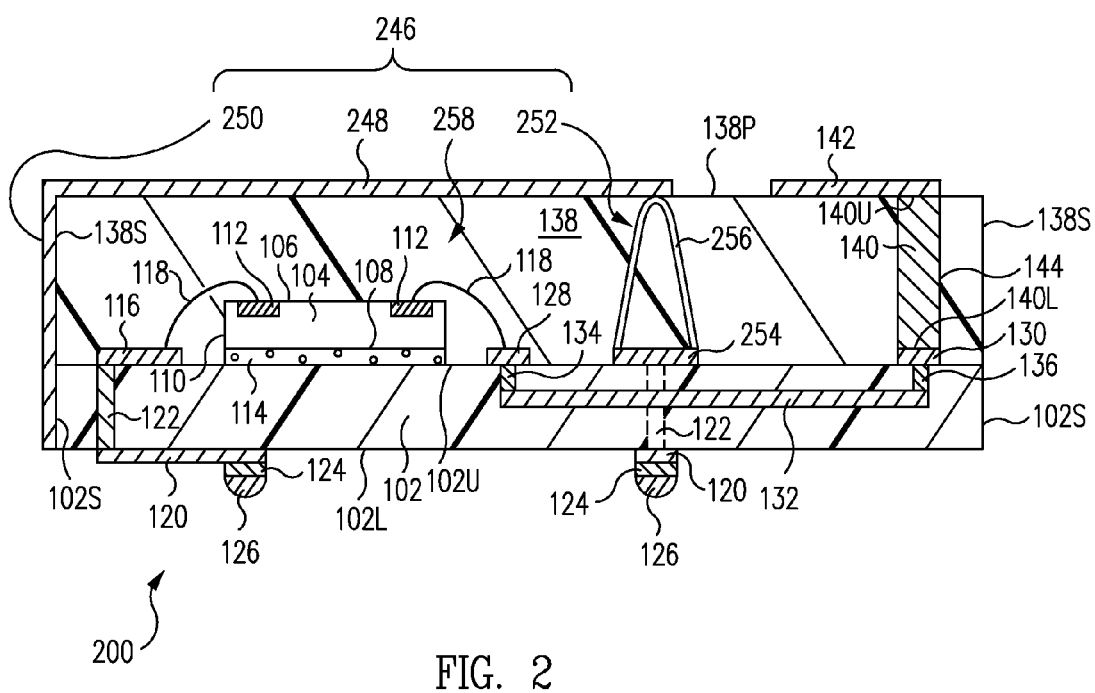
FIG. 2 is a cross-sectional view of a wireless electronic component package in accordance with another embodiment.

FIG. 2 is a cross-sectional view of a wireless electronic component package 200 in accordance with another embodiment. Wireless electronic component package 200 of FIG. 2 is substantially similar to wireless electronic component package 100 of FIG. 1 and only the significant differences between wireless electronic component package 200 and wireless electronic component package 100 are discussed below.

Referring now to FIG. 2, in accordance with this embodiment, wireless electronic component package 200 includes an electrically conductive shielding structure 246. Shielding structure 246 shields electronic component 104 and other passive or active electronic components of wireless electronic component package 200, e.g., a matching component, from electromagnetic radiation, e.g., from antenna 142, and generally shields electronic component 104 from electromagnetic interference (EMI).

Figure 3:
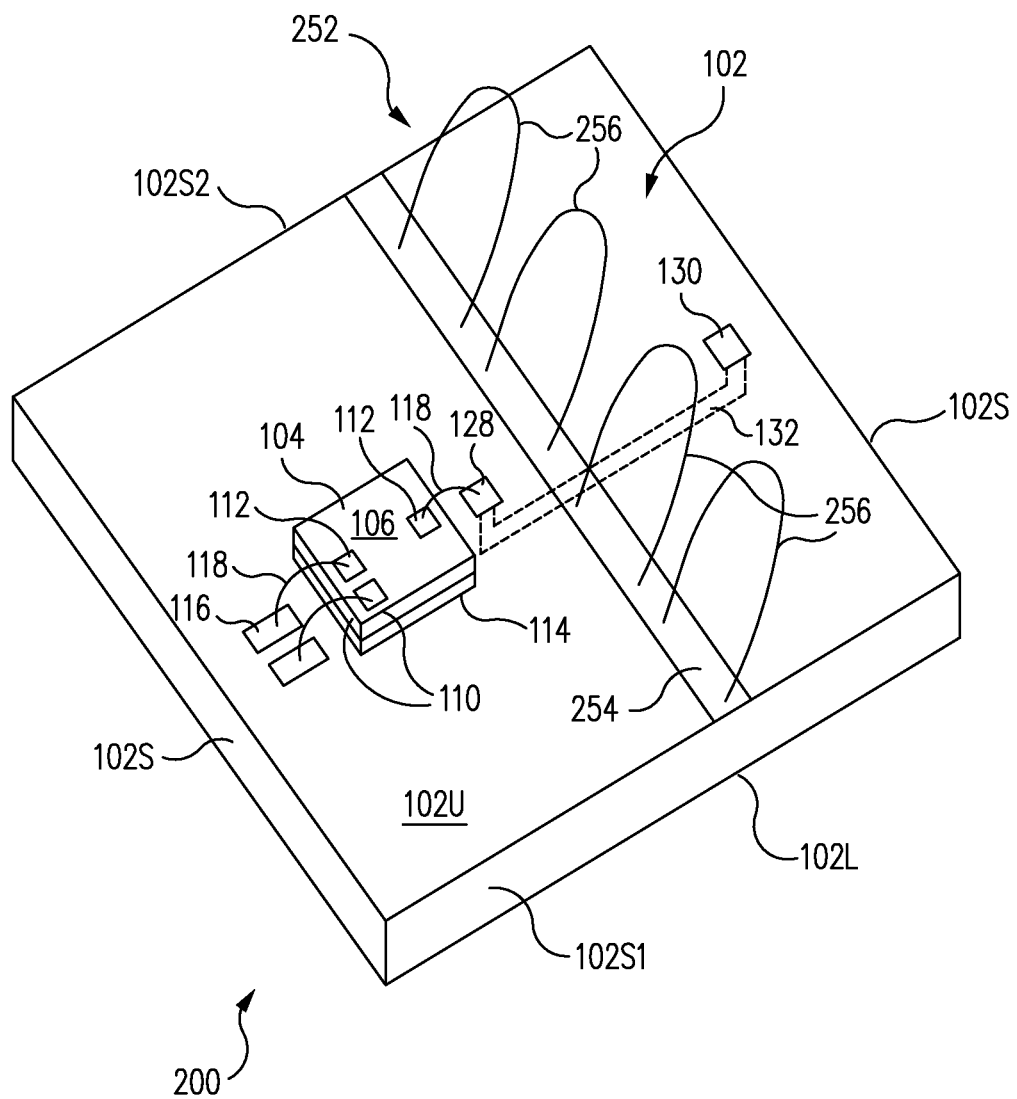
FIG. 3 is a top perspective view of the wireless electronic component package of FIG. 2 during fabrication and prior to formation of a package body.

FIG. 3 is a top perspective view of wireless electronic component package 200 of FIG. 2 during fabrication and prior to formation of package body 138. Referring now to FIGS. 2 and 3 together, shielding structure 246 includes a shield lid 248, shield lid sidewalls 250, and an embedded shield lid interconnect 252. Shield lid 248 is formed directly on and covers the portion of principal surface 138P of package body 138 directly above electronic component 104. Shield lid 248 extends from sides 138S of package body 138 to embedded shield lid interconnect 252.

Shield lid sidewalls 250 are electrically connected to shield lid 248. Shield lid sidewalls 250 are formed directly on and cover the portions of sides 138S of package body 138 adjacent electronic component 104. In one embodiment, as illustrated in FIG. 2, shield lid sidewalls 250 are further formed directly on and extend to cover the portions of sides 102S of substrate 102 adjacent electronic component 104.

In one embodiment, shield lid 248 and shield lid sidewalls 250 are formed of an electrically conductive material applied to principal surface 138P and sides 138S of package body 138. Illustratively, an electrically conductive coating, e.g., electrically conductive paint, is selectively sprayed and cured, e.g., dried, to form shield lid 248 and shield lid sidewalls 250. In another embodiment, an electrically conductive coating is non-selectively applied to package body 138 and patterned, e.g., using laser-ablation, to form shield lid 248 and shield lid sidewalls 250.

In one embodiment, shield lid 248 and shield lid sidewalls 250 are formed simultaneously with antenna 142. In this manner, manufacturing is simplified thus reducing the overall fabrication cost of wireless electronic component package 200. However, in another embodiment, shield lid 248 and shield lid sidewalls 250 are formed before, or after, antenna 142.

Shield lid interconnect 252 extends from a shield trace 254 to shield lid 248 through package body 138. In one embodiment, shield lid interconnect 252 is a wire fence extending lengthwise from one side 102S1 to the opposite side 102S2 of sides 102S of substrate 102.

Illustratively, shield trace 254 extends on upper surface 102U of substrate 102 between sides 102S1, 102S2, although can be formed of a smaller trace or a plurality of smaller traces. Shield lid interconnect 252 is formed of one or more wires 256 formed on shield trace 254, wires 256 forming a wire fence. The spacing between wires 256 is sufficiently small to prevent electromagnetic radiation from passing between wires 256 as discussed further below.

Although a particular configuration for wires 256 and shield trace 254 is illustrated in FIGS. 2 and 3, in light of this disclosure, those of skill in the art will understand that the configurations are illustrative, and other configurations are possible. Generally, see Scanlan et al., U.S. patent application Ser. No. 11/754,209, cited above regarding the formation and configuration of wire fences.

Shield trace 254 is electrically connected to a respective interconnection ball 126 by a respective via 122, lower trace 120, and interconnection pad 124. In one embodiment, shield trace 254 and thus shielding structure 246 is electrically connected to a reference voltage source, e.g., ground.

Although a single interconnect to shielding structure 246 through shield trace 254 is illustrate, in other examples, additional interconnects to shielding structure 246 are possible. For example, a shield trace can be formed on upper surface 102U at side 102S and to the left of upper trace 116 in the view of FIG. 2 and electrically connected to shielding structure 246. In another example, a ground trace of substrate 102 can be exposed at side 102S of substrate 102 and connected to shielding structure 246.

Accordingly, shielding structure 246 defines a shielded compartment 258 in which electronic component 104 is located. By locating electronic component 104 within shielded compartment 258, electronic component 104 is shielded from electromagnetic radiation emanating from antenna 142, also referred to herein as EMI from antenna 142, by shielding structure 246.

Specifically, shield lid interconnect 252 prevents EMI from passing sideways through package body 138 and to electronic component 104. Shield lid 248 prevents EMI from passing through principal surface 138P of package body 138 and to electronic component 104. Further, shield lid sidewalls 250 prevent EMI from passing through sides 138S of package body 138 and to electronic component 104. In one embodiment, a ground plane is formed in substrate 102, e.g., on an interlayer conductive plane of substrate 102, thus shielding electronic component 102 from EMI passing through substrate 102.

Further, by locating electronic component 104 within shielded compartment 258, antenna 142 is shielded from EMI emanating from electronic component 104 for reasons similar to those set forth above.

Figure 4:
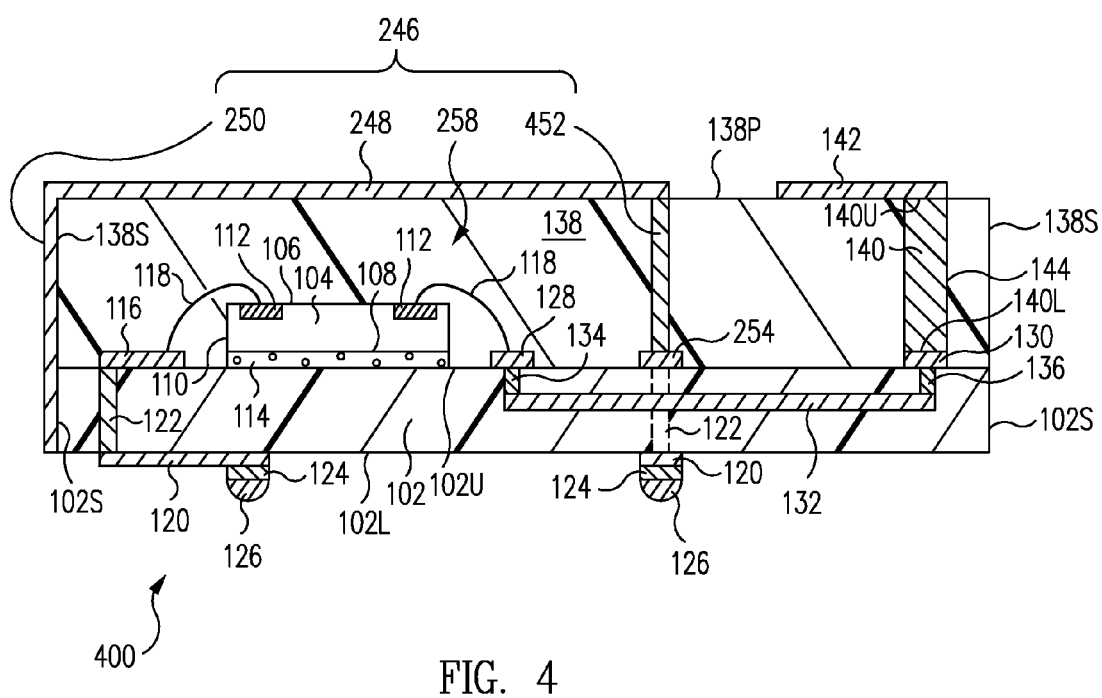
FIG. 4 is a cross-sectional view of a wireless electronic component package in accordance with another embodiment.
Figure 5:
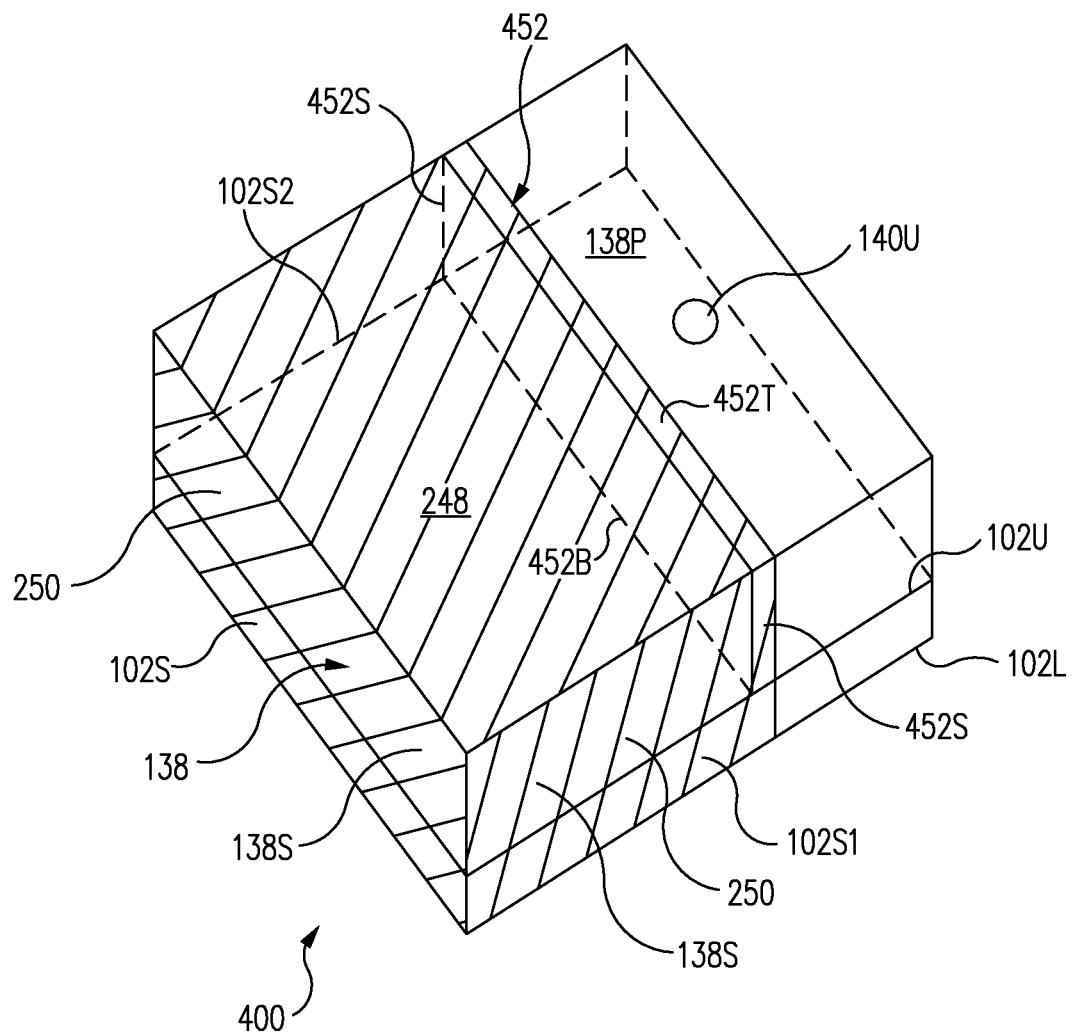
FIG. 5 is a perspective view of the wireless electronic component package of FIG. 4 in accordance with one embodiment.

FIG. 4 is a cross-sectional view of a wireless electronic component package 400 in accordance with another embodiment. FIG. 5 is a perspective view of wireless electronic component package 400 of FIG. 4 in accordance with one embodiment. In FIG. 5, the outlines of substrate 102, package body 138, and a shield lid interconnect 452 are illustrated in dashed lines for clarity of presentation.

Wireless electronic component package 400 of FIGS. 4, 5 is substantially similar to wireless electronic component package 200 of FIG. 2 and only the significant differences between wireless electronic component package 400 and wireless electronic component package 200 are discussed below. More particularly, wireless electronic component package 400 is formed with shield lid interconnect 452 as described below whereas wireless electronic component package 200 is formed with shield lid interconnect 252 as described above.

Referring now to FIGS. 4 and 5 together, in accordance with this embodiment, shielding structure 246 includes shield lid 248, shield lid sidewalls 250, and embedded shield lid interconnect 452.

Shield lid interconnect 452 extends from shield trace 254 to shield lid 248 through package body 138. In one embodiment, shield lid interconnect 452 is conductive wall extending lengthwise from one side 102S1 to the opposite side 102S2 of substrate 102 in a manner similar to that described above regarding shield lid interconnect 252 and illustrated in FIG. 3.

Shield lid interconnect 452 includes sides 452S parallel to and coplanar with sides 138S of package body 138. Further, shield lid interconnect 452 includes a top 452T parallel to and coplanar with principal surface 138P of package body 138. Generally, sides 452S and top 452T of shield lid interconnect 452 are exposed from package body 138 and, in one embodiment, covered by shield lid 248 and shield lid sidewalls 250. Shield lid interconnect 452 further includes a bottom 452B on upper surface 102U of substrate 102, and more particularly, on shield trace 254.

Shield lid 248 covers top 452T of shield lid interconnect 452 and the entire portion of principal surface 138P to the left of shield lid interconnect 452 in the view of FIGS. 4, 5. Further, shield lid sidewalls 250 cover sides 452S of shield lid interconnect 452 and the portion of sides 102S1, 102S2 directly below sides 452S. Further, shield lid sidewalls 250 cover the portions of sides 138S, 102S1, 102S2 to the left of sides 452S including completely covering the sides 138S, 102S at the left in the view of FIGS. 4, 5.

Wireless electronic component package 400 is fabricated in a manner similar to that set forth above regarding wireless electronic component package 200 and only the significant differences in the fabrication method are set forth below. More particularly, after fabrication of package body 138, a trench is formed, e.g., using laser-ablation, in package body 138 to expose shield trace 254. This trench is filled with an electrically conductive filler material to form shield lid interconnect 452.

In one embodiment, shield lid interconnect 452 tapers due to the laser-ablation process, i.e., the area of top 452T is greater than the area of bottom 452B of shield lid interconnect 452. In accordance with this embodiment, shield lid interconnect 452 prevents EMI from passing sideways through package body 138 and to/from electronic component 104.

Figure 6:
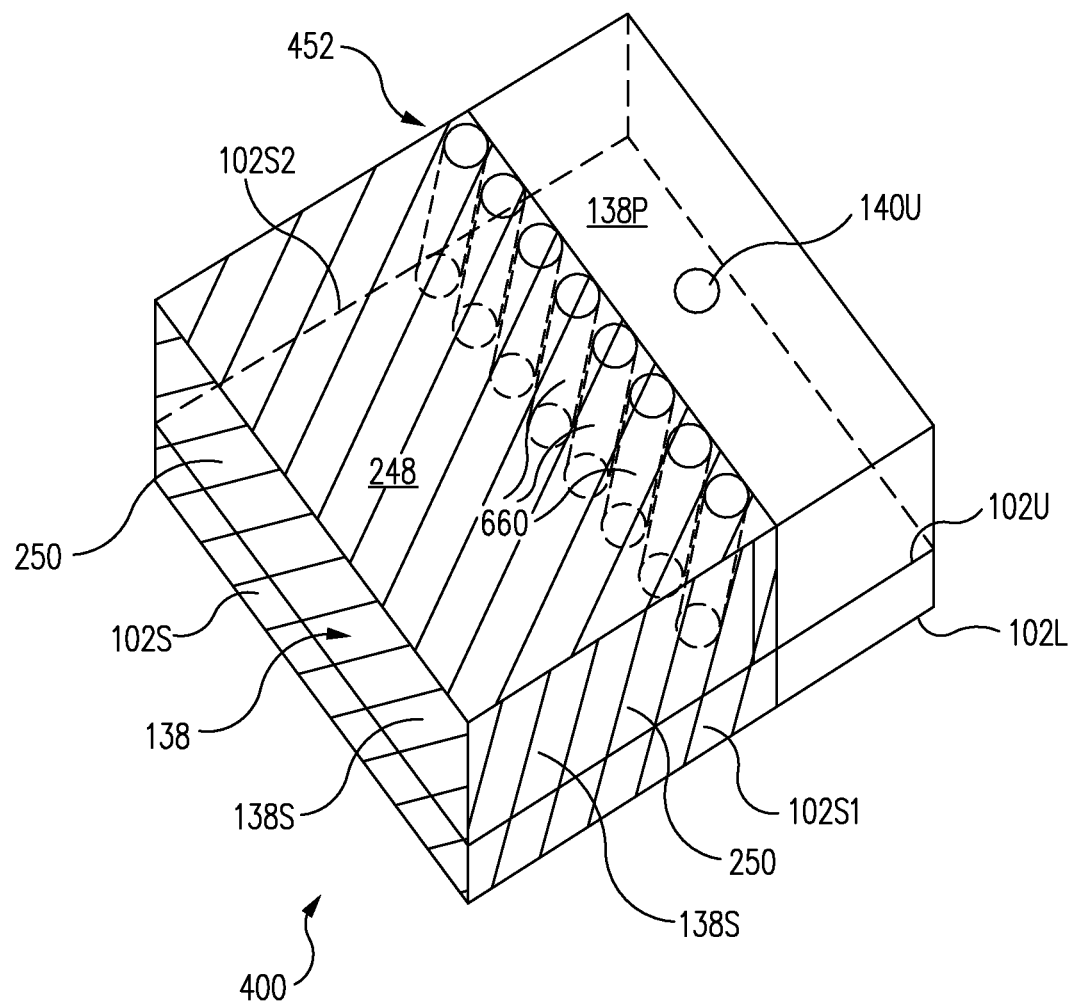
FIG. 6 is a perspective view of the wireless electronic component package of FIG. 4 in accordance with another embodiment.

FIG. 6 is a perspective view of wireless electronic component package 400 of FIG. 4 in accordance with another embodiment. In FIG. 6, the outlines of substrate 102, package body 138, and shield lid interconnect 452 are illustrated in dashed lines for clarity of presentation.

Referring now to FIGS. 4 and 6 together, in accordance with this embodiment, shield lid interconnect 452 includes a plurality of conductive vias 660 arranged in a side-by-side configuration to extend lengthwise from one side 102S1 to the opposite side 102S2 of substrate 102 in a manner similar to that described above regarding shield lid interconnect 252 as illustrated in FIG. 3.

Wireless electronic component package 400 is fabricated in a manner similar to that set forth above regarding wireless electronic component package 200 and only the significant differences in the fabrication method are set forth below. More particularly, after fabrication of package body 138, a plurality of via apertures are formed, e.g., using laser-ablation, in package body 138 to expose portions of shield trace 254. These via apertures are filled with an electrically conductive filler material to form vias 660, i.e., to form shield lid interconnect 452. In one embodiment, vias 660 taper due to the laser-ablation process, i.e., the diameter of vias 660 at principal surface 138P is greater than the diameter of vias 660 at upper surface 102U.

The spacing between vias 660 is sufficiently small to prevent electromagnetic radiation from passing between vias 660. In accordance with this embodiment, shield lid interconnect 452 prevents EMI from passing sideways through package body 138 and to/from electronic component 104.

Although various examples are set forth above of forming a shield lid interconnect, e.g., shield lid interconnect 252 of FIGS. 2, 3 and shield lid interconnect 452 of FIGS. 4, 5, 6, these examples are illustrative only and other shield lid interconnects are formed in other embodiments. Generally, a shield lid interconnect: (1) provides the electrical connection to shield lid 248 and shield lid sidewalls 250 through package body 138; and/or (2) prevents EMI from passing sideways through package body 138 to/from electronic component 104.

Further, a shield lid interconnect is formed using any one of the methods described above and including: (1) forming a wire fence and enclosing the wire fence in package body 138; (2) forming a trench in package body 138, e.g., using laser-ablation, and filling the trench; (3) forming one or more via apertures in package body 138, e.g., using laser-ablation and filling the via apertures; (4) forming one or more interconnection balls and enclosing the interconnection balls in package body 138 such that the interconnection balls are exposed from package body 138; (5) forming one or more interconnection balls, totally enclosing the interconnection balls in package body 138, forming via apertures in package body 138 to expose the interconnection balls, and filling the via apertures; (6) forming one or more stacks of interconnection balls and enclosing the stacks within package body 138; and (7) forming one or more via apertures in package body 138, e.g., using laser-ablation, and filling the via apertures with stacks of interconnection balls.

Figure 7:
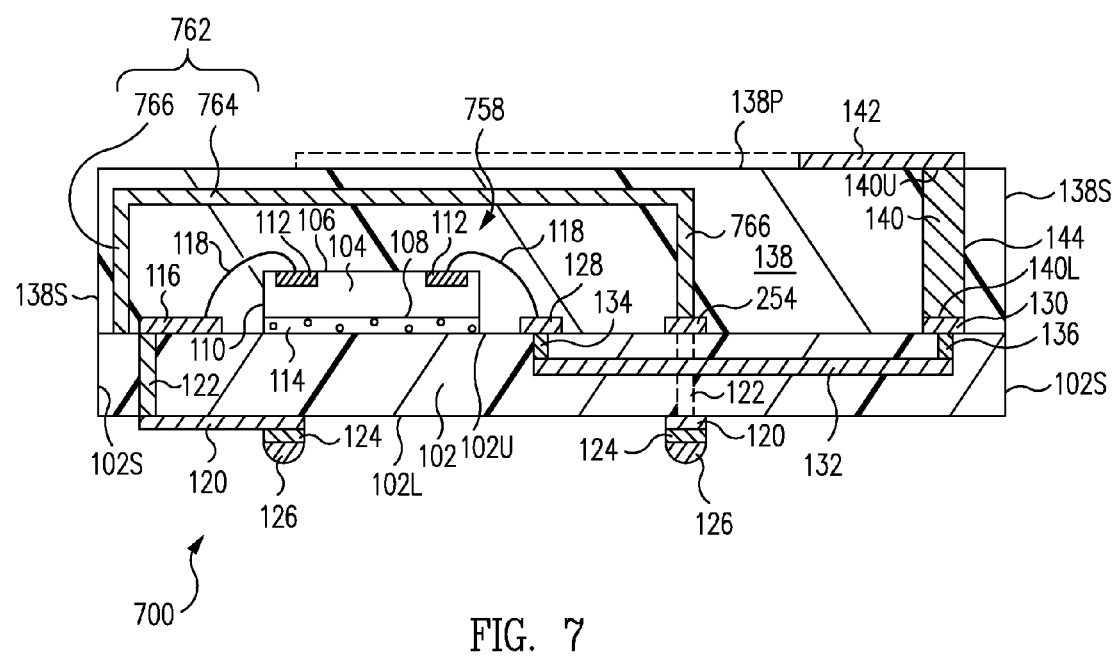
FIG. 7 is a cross-sectional view of a wireless electronic component package in accordance with yet another embodiment.

FIG. 7 is a cross-sectional view of a wireless electronic component package 700 in accordance with yet another embodiment. Wireless electronic component package 700 of FIG. 7 is substantially similar to wireless electronic component package 200 of FIG. 2 and only the significant differences between wireless electronic component package 700 and wireless electronic component package 200 are discussed below. More particularly, wireless electronic component package 700 is formed with an embedded shielding structure 762 as described below whereas wireless electronic component package 200 is formed with shielding structure 246 as described above.

Referring now to FIG. 7, in accordance with this embodiment, embedded shielding structure 762 is an electrically conductive enclosure, for example, a metal can. Shielding structure 762 includes a shield lid 764 and shield lid sidewalls 766. Shield lid 764 is parallel to and located directly above active surface 106 of electronic component 104. Shield lid sidewalls 766 are parallel to and located adjacent to all four sides 110 of electronic component 104.

Shield lid sidewalls 766 are electrically connected to shield trace 254. Accordingly, shielding structure 762 defines a shielded compartment 758 in which electronic component 104 is located. By locating electronic component 104 within shielded compartment 758, electronic component 104 is shielded from EMI from antenna 142 by shielding structure 762. Further, by locating electronic component 104 within shielded compartment 758, antenna 142 is shielded from EMI emanating from electronic component 104.

Package body 138 encloses shielding structure 762. More particularly, package body 138 encloses and electrically isolates shield lid 764 and shield lid sidewalls 766 from antenna 142. Package body 138 exist between principal surface 138P and shield lid 764. Further, package body 138 exist between sides 138S of package body 138 and shield lid sidewalls 766.

As shielding structure 762 is completing enclosed within package body 138, antenna 142 can be formed anywhere upon principal surface 138P of package body 138. In one embodiment, as indicated by the dashed lines in FIG. 7, antenna 142 extends upon principal surface 138P to be located directly above electronic component 104. In this manner, maximum flexibility in the design of antenna 142 is achieved.

In one embodiment, shielding structure 762 has openings formed therein to allow the material, e.g., mold compound, of package body 138 to fill shielding structure 762. These openings are sufficiently small to prevent EMI from passing through the openings.

In another embodiment, shielding structure 762 does not include openings such that package body 138 does not fill shielding structure 762. Illustratively, shielding structure 762 and thus shielded compartment 758 contains air.

Figure 8:
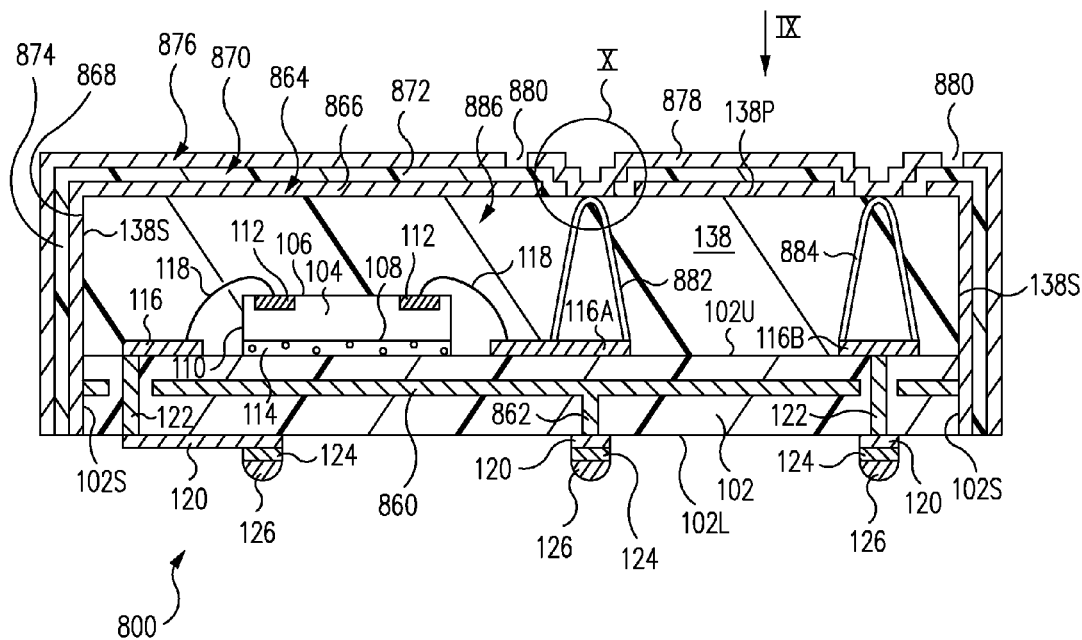
FIG. 8 is a cross-sectional view of an electronic component package in accordance with one embodiment.

FIG. 8 is a cross-sectional view of an electronic component package 800 in accordance with one embodiment. Electronic component package 800 of FIG. 8 is similar to wireless electronic component package 100 of FIG. 1. More particularly, electronic component package 800 includes substrate 102, upper surface 102U, lower surface 102L, sides 102S, electronic component 104, active surface 106, inactive surface 108, sides 110, bond pads 112, adhesive 114, upper traces 116, bond wires 118, lower traces 120, vias 122, pads 124, interconnection balls 126, and package body 138 similar or identical to substrate 102, upper surface 102U, lower surface 102L, sides 102S, electronic component 104, active surface 106, inactive surface 108, sides 110, bond pads 112, adhesive 114, upper traces 116, bond wires 118, lower traces 120, vias 122, pads 124, interconnection balls 126, and package body 138 of wireless electronic component package 100.

Referring now to FIG. 8, in accordance with this embodiment, substrate 102 includes an electrically conductive internal plane 860, e.g., a ground plane, hereinafter referred to as ground plane 860 for simplicity. Ground plane 860 is formed within (internal to) substrate 102 and between, but separated from, upper surface 102U and lower surface 102L. In accordance with this embodiment, ground plane 860 is exposed at sides 102S of substrate 102.

Ground plane 860 is electrically connected to a respective interconnection ball 126 by a via 862, sometimes called a ground via 862, a respective lower trace 120 connected to ground via 862, and interconnection pad 124. In one embodiment, ground plane 860 is electrically connected to a reference voltage source, e.g., ground, through the respective interconnection ball 126. Although a single interconnect to ground plane 860 through ground via 862 is illustrate, in other examples, additional interconnects to ground plane 860 are formed.

Electronic component package 800 further includes a conformal shield 864. Conformal shield 864 directly contacts, covers, and encloses principal surface 138P of package body 138, sides 138S of package body 138, and sides 102S of substrate 102.

Conformal shield 864 is formed of an electrically conductive material. For example, conformal shield 864 is formed of a urethane base silver paint that is sprayed on principal surface 138P of package body 138, sides 138S of package body 138, and sides 102S of substrate 102 and then cured, e.g., dried.

As set forth above, ground plane 860, e.g., teeth thereof or the entire periphery of ground plane 860 itself, is exposed at sides 102S of substrate 102. Accordingly, conformal shield 864 contacts ground plane 860 at sides 102S of substrate 102. Accordingly, conformal shield 864 is electrically connected to ground plane 860 and thus held at a reference voltage, e.g. ground. In other examples, conformal shield 864 is connected to ground using a shield lid interconnect as described above and related structures, e.g., similar to shield lid interconnect 252 of wireless electronic component package 200 of FIGS. 2, 3 and shield lid interconnect 452 of wireless electronic component package 400 of FIGS. 4, 5, 6 and related structures.

Conformal shield 864 includes a shield lid 866 and shield lid sidewalls 868. Shield lid 866 covers the entire principal surface 138P of package body 138. Shield lid sidewalls 868 cover the entire sides 138S of package body 138 and sides 102S of substrate 102.

Electronic component package 800 further includes a dielectric shield isolation layer 870. Shield isolation layer 870 directly contacts, covers, and encloses conformal shield 864 including shield lid 866 and shield lid sidewalls 868.

Shield isolation layer 870 is formed of a dielectric material. For example, shield isolation layer 870 is formed of a dielectric material that is sprayed on conformal shield 864 including shield lid 866 and shield lid sidewalls 868 and then cured, e.g., dried.

Shield isolation layer 870 includes a shield isolation lid 872 and shield isolation sidewalls 874. Shield isolation lid 872 covers the entire shield lid 866 of conformal shield 864. Shield isolation sidewalls 874 cover the entire shield lid sidewalls 868 of conformal shield 864.

Electronic component package 800 further includes a conformal top feature layer 876. Conformal top feature layer 876 directly contacts, covers, and encloses shield isolation layer 870.

Conformal top feature layer 876 is formed of an electrically conductive material. For example, conformal top feature layer 876 is formed of a urethane base silver paint that is sprayed on shield isolation layer 870 and then cured, e.g., dried. The electrically conductive material is then patterned, e.g., using laser-ablation, to form one or more top features 878 of conformal top feature layer 876. Although a rectangular top feature 878 is illustrated, in other embodiments, a top feature is formed to have any desired shape, e.g., a spiral, zigzag lines, patches, curves, or other shape.

Figure 9:
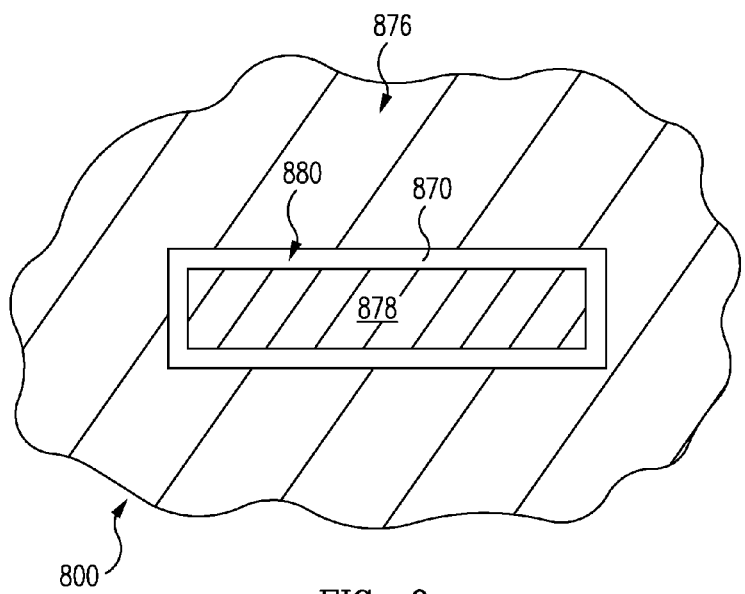
FIG. 9 is a top plan view of the electronic component package of FIG. 8 along the line IX illustrating a top feature in accordance with one embodiment.

FIG. 9 is a top plan view of electronic component package 800 of FIG. 8 along the line IX illustrating a top feature 878 in accordance with one embodiment. Referring now to FIGS. 8 and 9 together, top feature 878 is a signal trace in accordance with this embodiment. Top feature 878 is defined by forming a trench 880 through conformal top feature layer 876 entirely around top feature 878. Shield isolation layer 870 is exposed through trench 880. Accordingly, top feature 878 is electrically isolated from the remainder of conformal top feature layer 876.

However, top feature 878 is electrically connected to electrically conductive embedded interconnects 882, 884 through openings in conformal shield 864 and shield isolation layer 870 as discussed further below. In accordance with this embodiment, embedded interconnect 882 is formed on and electrically connected to a first upper trace 116A of the plurality of upper traces 116. Upper trace 116A is electrically connected to a respective bond pad 112 by a respective bond wire 118. Similarly, embedded interconnect 884 is formed on and electrically connected to a second upper trace 116B of the plurality of upper traces 116. Upper trace 116B is electrically connected to a respective interconnection ball 126 by a respective via 122, lower trace 120, and pad 124.

Accordingly, a signal generated by electronic component 104 is propagated from bond pad 112, to bond wire 118, to upper trace 116A, to embedded interconnect 882, to top feature 878, to embedded interconnect 884, to upper trace 116B, to via 122, to interconnection pad 124, and to interconnection ball 126, and finally to a structure connected to interconnection ball 126, e.g., to a printed circuit motherboard on which electronic component package 800 is mounted.

Conformal shield 864 defines a shielded compartment 886 in which electronic component 104 is located. By locating electronic component 104 within shielded compartment 886, electronic component 104 is shielded from EMI from top feature 878 by conformal shield 864 and vice versa. Specifically, shield lid 866 of conformal shield 864 prevents EMI from passing through principal surface 138P of package body 138 and to/from electronic component 104.

Further, by locating conformal shield 864 close to top feature 878, i.e., only separated by shield isolation layer 870, conformal shield 864 acts as a ground plane for top feature 878. The thickness of shield isolation layer 870 is controlled to provide desired electrical properties. In this manner, the impedance of top feature 878 is controlled, e.g., minimized, as compared to forming a similar top feature without a ground plane.

Although top feature 878 is set forth as a signal trace in accordance with this embodiment, in other embodiments, other top features such as circuit patterns and/or antennas are patterned in conformal top feature layer 876. Illustratively, a circuit pattern includes a plurality of signal traces formed in conformal top feature layer 876.

In another embodiment, top feature 878 is an antenna in conformal top feature layer 876. In one example where top feature 878 is an antenna, top feature 878 is connected to embedded interconnect 882 only, e.g., embedded interconnect 884 is not formed. Thus, a signal generated by electronic component 104 is propagated from bond pad 112, to bond wire 118, to upper trace 116A, to embedded interconnect 882, and to top feature 878, which is an antenna. Illustratively, top feature 878 is an antenna similar to antenna 142 as described above.

As set forth above, embedded interconnects 882, 884 are electrically connected to top feature 878 through openings in conformal shield 864 and shield isolation layer 870. FIGS. 10, 11, 12, 13 and 14 are enlarged cross-sectional views of the region X of electronic component package 800 of FIG. 8 during various stages of formation of the electrical connection of embedded interconnect 882 to top feature 878 in accordance with various embodiments.

Although a single connection to top feature 878 is illustrated in FIGS. 10, 11, 12, 13 and 14, in light of this disclosure, those of skill in the art will understand that electrical connection to the other top features of conformal top feature layer 876 are made simultaneously in a similar manner. For example, the connection between embedded interconnect 884 and top feature 878 is made simultaneously and in a similar manner.

Further, although a wire fence type embedded interconnect 884 is illustrated and discussed below, in other embodiments, embedded interconnect 884 is any of the embedded interconnects as described above, e.g., is similar to any of the embodiments described above in reference to embedded interconnect 140 of wireless electronic component package 100 of FIG. 1.

Figure 10:
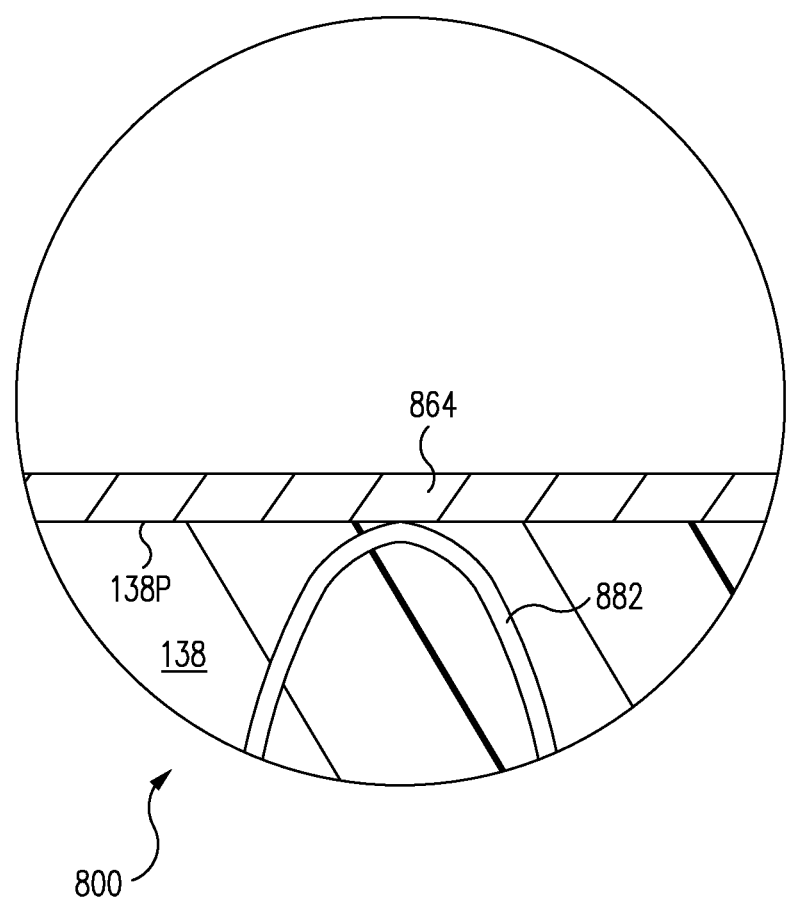
FIGS. 10, 11, 12, 13 and 14 are enlarged cross-sectional views of the region X of the electronic component package of FIG. 8 during various stages of formation of an electrical connection of an embedded interconnect to the top feature in accordance with various embodiments.

Referring now to FIGS. 8 and 10 together, embedded interconnect 882, e.g., a wire fence or wire, is formed. Embedded interconnect 882 is enclosed within package body 138 such that embedded interconnect 882 is exposed at principal surface 138P.

Figure 11:
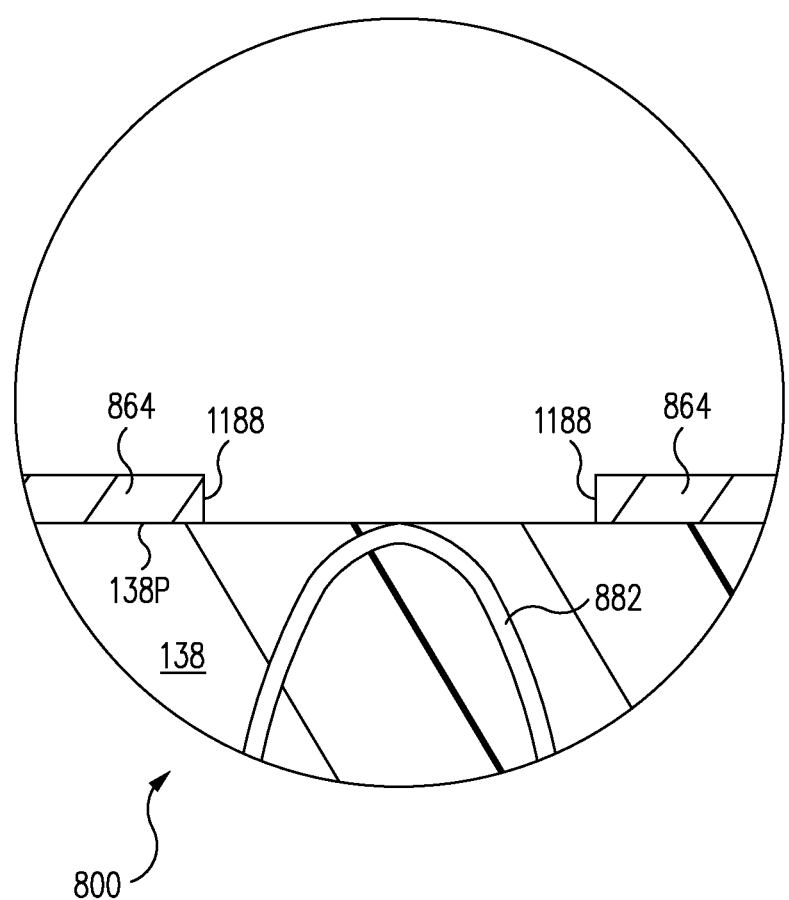

Conformal shield 864 is formed on package body 138 including principal surface 138P as illustrated in FIG. 10. Referring now to FIGS. 8, 10 and 11 together, a conformal shield opening 1188, sometimes called a conformal shield aperture, is formed in conformal shield 864 to expose embedded interconnect 882.

Figure 12:
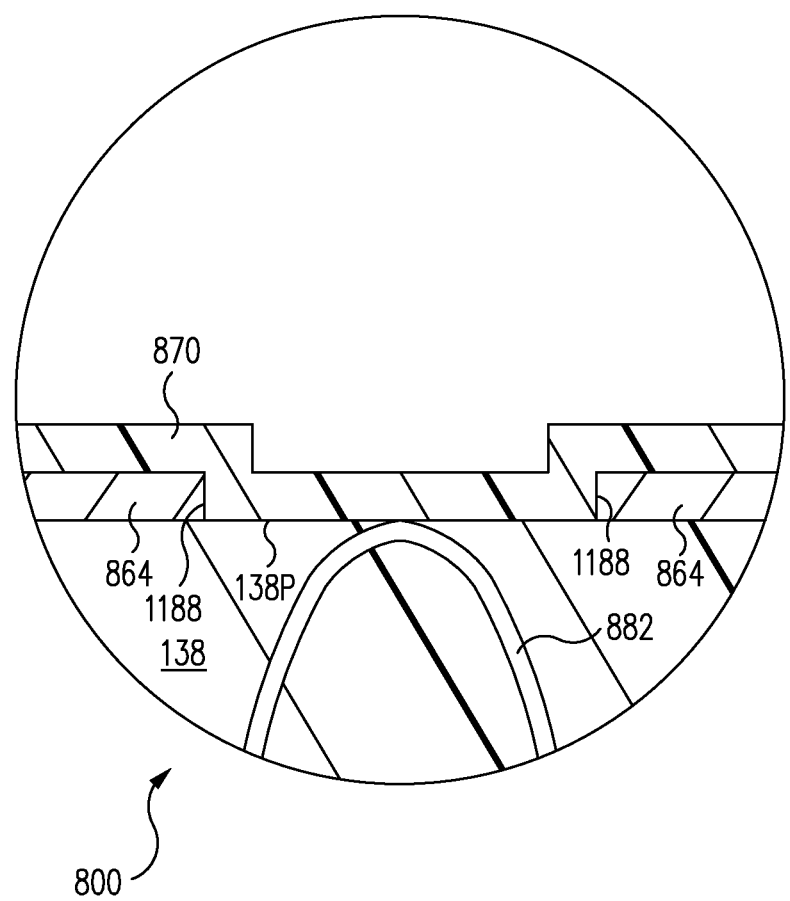
Figure 13:
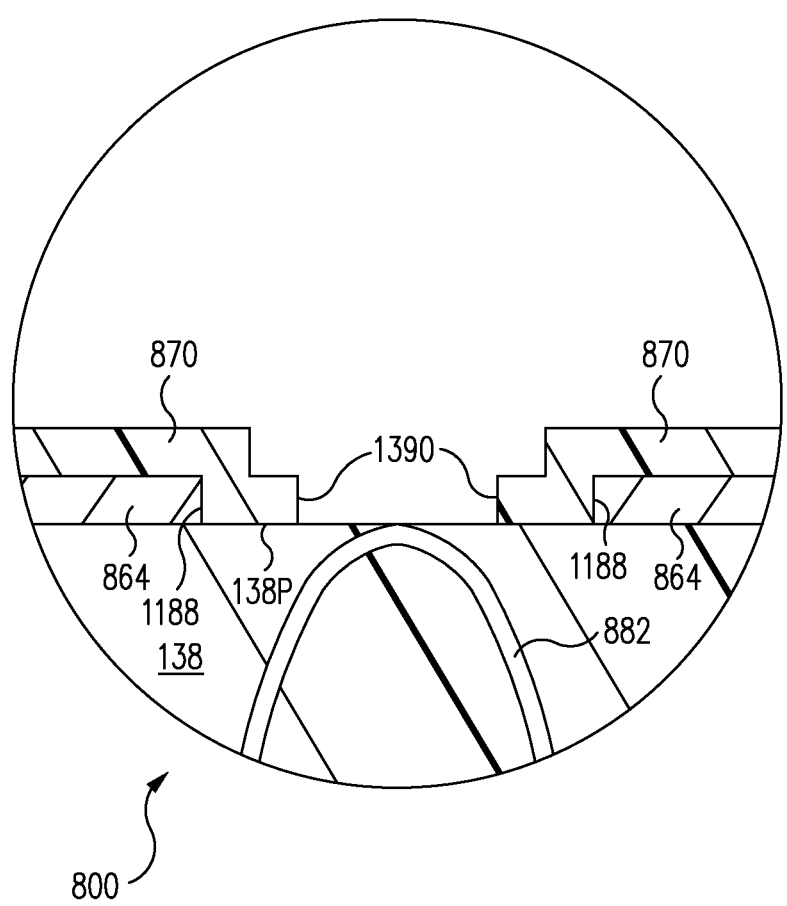

Referring now to FIGS. 8 and 12 together, shield isolation layer 870 is formed on conformal shield 864 and within conformal shield opening 1188. Referring now to FIGS. 8, 12 and 13 together, a shield isolation layer opening 1390 is formed in shield isolation layer 870 to expose embedded interconnect 882.

Shield isolation layer opening 1390 is smaller than conformal shield opening 1188. Accordingly, a portion of shield isolation layer 870 remains on principal surface 138P of package body 138 within conformal shield opening 1188 and adjacent the circumference of conformal shield opening 1188. Thus, shield isolation layer 870 completely covers and electrically isolates conformal shield 864.

Figure 14:
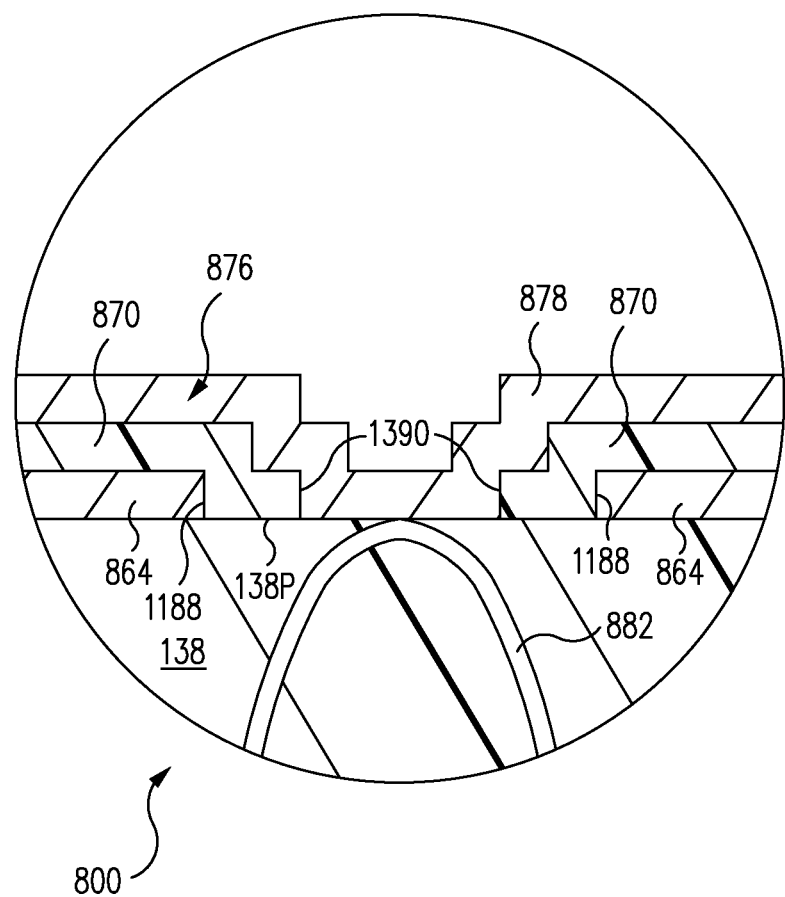

Referring now to FIGS. 8 and 14 together, conformal top feature layer 876 is formed on shield isolation layer 870 and within shield isolation layer opening 1390 and conformal shield opening 1188. As embedded interconnect 882 is exposed through shield isolation layer opening 1390, conformal top feature layer 876 directly contacts and is electrically connected to embedded interconnect 882.

Further, conformal top feature layer 876 is electrically isolated from conformal shield 864 by shield isolation layer 870. Conformal top feature layer 876 is then pattern, e.g., by laser-ablation, thus forming top feature 878 within top feature layer 876.

Embedded interconnects 882, 884 are illustrated and discussed above as providing the connection between upper traces 116A, 116B and top feature 878. However, in another embodiment, a trace of substrate 102, e.g., an upper trace 116, a lower trace 120, or an internal trace, is extended to project horizontally outwards from sides 102S of substrate 102. This extended trace extends through corresponding openings in conformal shield 864 and shield isolation layer 870 to connect to a top feature of conformal top feature layer 876.

Further, although a single shield isolation layer 870 and conformal top feature layer 876 are illustrated and discussed above, in another embodiment, additional shield isolation layers and conformal top feature layers including top features can be formed as discussed below in reference to FIG. 15.

Figure 15:
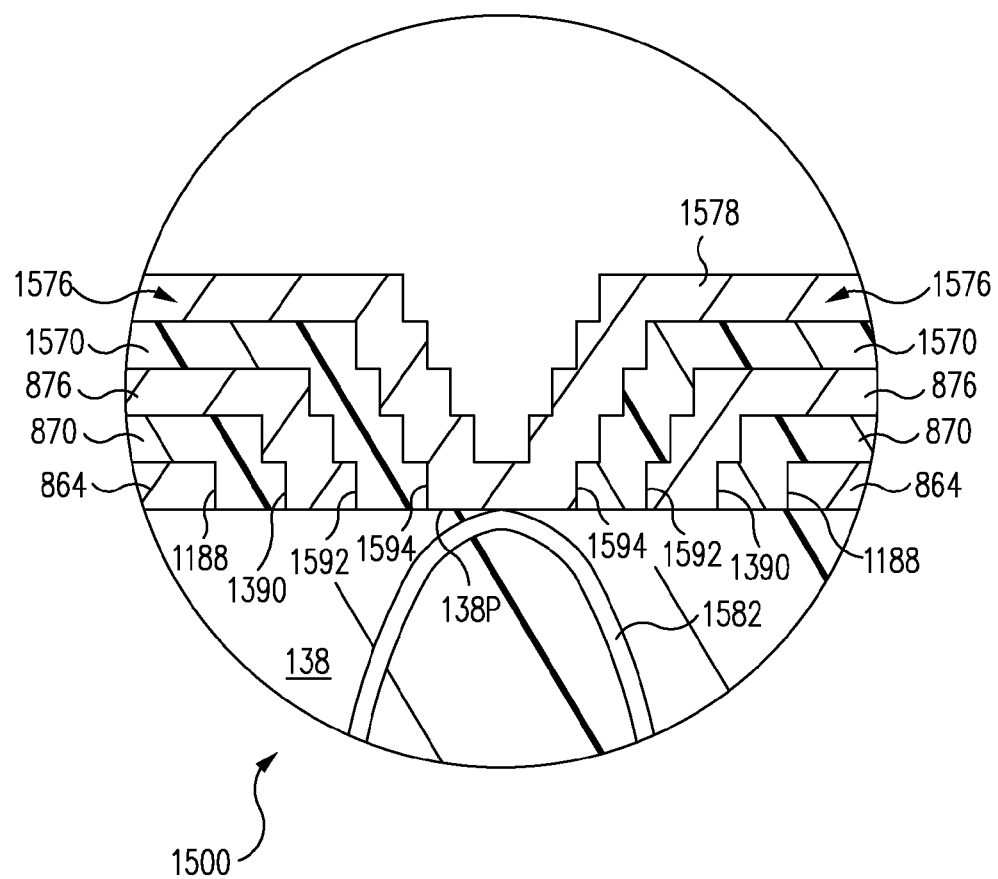
FIG. 15 is an enlarged cross-sectional view of a region of an electronic component package illustrating an electrical connection of an embedded interconnect to a top feature of a second conformal top feature layer in accordance with one embodiment.

FIG. 15 is an enlarged cross-sectional view of a region of an electronic component package 1500 illustrating an electrical connection of an embedded interconnect 1582 to a top feature 1578 of a second conformal top feature layer 1576 in accordance with one embodiment.

Referring now to FIG. 15, conformal shield opening 1188 and shield isolation layer opening 1390 are formed within conformal shield 864 and shield isolation layer 870 to expose embedded interconnect 1582 in a manner similar to that discussed above.

Conformal top feature layer 876 is formed on shield isolation layer 870 and within shield isolation layer opening 1390. A conformal top feature layer opening 1592 is formed in conformal top feature layer 876 to expose embedded interconnect 1582. Although conformal top feature layer opening 1592 is illustrated in FIG. 15 as being smaller than shield isolation layer opening 1390, conformal top feature layer opening 1592 is bigger than shield isolation layer opening 1390 in other embodiments.

Second isolation layer 1570 is formed on conformal top feature layer 876 and within conformal top feature layer opening 1592. A second isolation layer opening 1594 is formed in second isolation layer 1570 to expose embedded interconnect 1582.

Second isolation layer opening 1594 is smaller than conformal top feature layer opening 1592. Accordingly, a portion of second isolation layer 1570 remains on principal surface 138P of package body 138 within conformal top feature layer opening 1592 and adjacent the circumference of conformal top feature layer opening 1592. Thus, second isolation layer 1570 completely covers and electrically isolates conformal top feature layer 876.

Second conformal top feature layer 1576 is formed on second isolation layer 1570 and within second isolation layer opening 1594. As embedded interconnect 1582 is exposed through second isolation layer opening 1594, second conformal top feature layer 1576 directly contacts and is electrically connected to embedded interconnect 1582. Further, second conformal top feature layer 1576 is electrically isolated from conformal top feature layer 876 by second isolation layer 1570. Second conformal top feature layer 1576 is then pattern, e.g., by laser-ablation, thus forming top feature 1578 within second top feature layer 1576.

Figure 16:
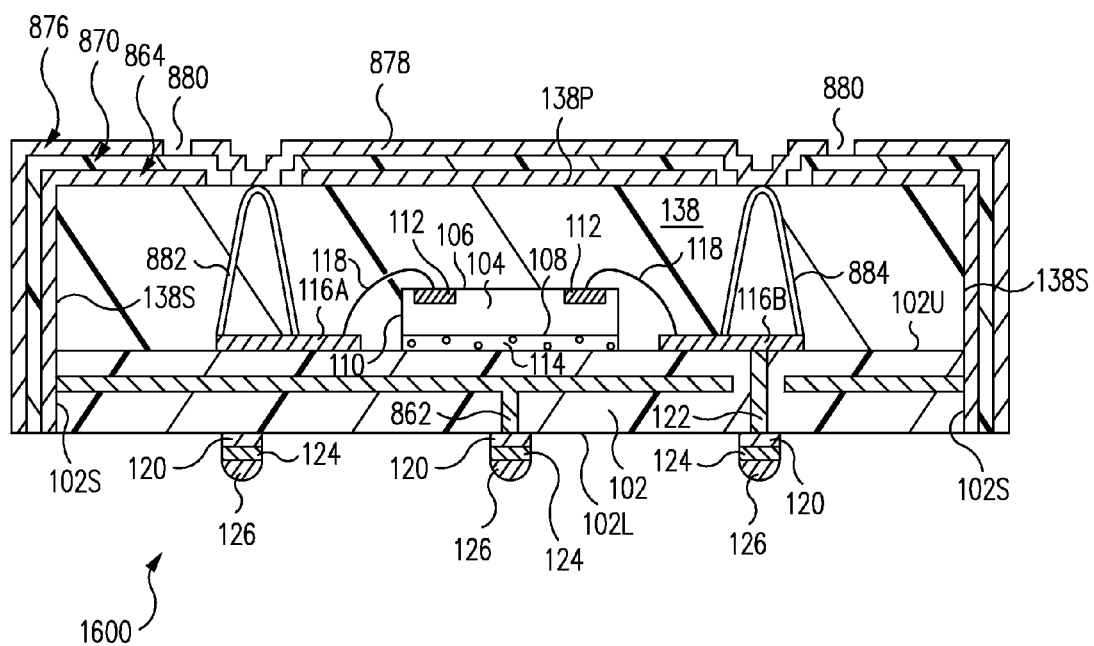
FIG. 16 is a cross-sectional view of an electronic component package in accordance with another embodiment.

FIG. 16 is a cross-sectional view of an electronic component package 1600 in accordance with another embodiment. Electronic component package 1600 of FIG. 16 is substantially similar to electronic component package 800 of FIG. 8 and only the significant differences between electronic component package 1600 and electronic component package 800 are discussed below.

Referring now to FIG. 16, in accordance with this embodiment, a respective bond pad 112 is connected by a respective bond wire 118 to upper trace 116A. Upper trace 116A is connected to embedded interconnect 882. Embedded interconnect 882 is connected to top feature 878. Top feature 878 is connected to embedded interconnect 884. Embedded interconnect 884 is connected to upper trace 116B and to a respective bond pad 112 by a respective bond wire 118.

FIG. 16 illustrates another specific example of an interconnect using top feature 878 extending above electronic component 104. In light of this disclosure, those of skill in the art will understand that any one of a number of interconnects can be formed using one or more top features depending upon the particular application.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An electronic component package comprising:
   a substrate comprising a first substrate surface, a second substrate surface opposite the first substrate surface, and side substrate surfaces extending between the first substrate surface and the second substrate surface;
   an electronic component mounted to the first substrate surface;
   a shield trace on the first substrate surface, the shield trace extending from a first of the side substrate surfaces toward a second of the side substrate surfaces while extending past the electronic component;
   a dielectric package body directly contacting and enclosing the electronic component and covering the first substrate surface around the electronic component, the package body comprising a principal body surface and outer side body surfaces extending from the principal body surface; and
   a shield lid interconnect for electrically coupling the shield trace to a shielding structure, the shield lid interconnect in direct contact with and extending through the package body between the first substrate surface and the principal body surface and coupled to the shield trace, where the shield lid interconnect is configured as an electromagnetic interference (EMI) shield.

2. The electronic component package of claim 1, further comprising the shielding structure shielding the electronic component.

3. The electronic component package of claim 2, wherein the shielding structure comprises a shield lid formed directly on and covering a portion of the principal body surface directly above the electronic component.

4. The electronic component package of claim 3, wherein the shielding structure comprises a shield lid sidewall formed directly on and covering at least one of the outer side body surfaces.

5. The electronic component package of claim 1, wherein the shield lid interconnect comprises a planar side that is coplanar with one of the outer side body surfaces.

6. The electronic component package of claim 2, wherein the shielding structure comprises a shield lid that covers only a portion of the principal body surface.

7. The electronic component package of claim 2, wherein the shielding structure comprises a shield lid sidewall that covers only a portion of a respective one of the substrate side surfaces.

8. The electronic component package of claim 1, wherein the shield trace extends to the second of the side substrate surfaces.

9. The electronic component package of claim 1, wherein the shield lid interconnect comprises a conductive planar wall that extends between the shield trace and the principal body surface.

10. The electronic component package of claim 9, wherein the conductive planar wall extends from a first one of the substrate side surfaces to a second one of the substrate side surfaces.

11. The electronic component package of claim 1, wherein the shield lid interconnect comprises a surface parallel to and coplanar with the principal body surface.

12. The electronic component package of claim 1, wherein the shield lid interconnect comprises a plurality of conductive vias extending through the package body.

13. The electronic component package of claim 12, wherein the plurality of conductive vias are arranged in a side by side configuration along the shield trace.

14. The electronic component package of claim 12, further comprising laser ablated via apertures in the package body, wherein the conductive vias comprise electrically conductive material in the via apertures.

15. A method of forming an electronic component package, the method comprising:
    mounting an electronic component to a first surface of a substrate;
    directly contacting and enclosing the electronic component and the first surface in a package body, the package body comprising a first body surface facing the substrate and a principal body surface opposite the first body surface;
    forming a plurality of empty via apertures in the package body to expose a shield trace on the first surface, each of the empty via apertures comprising a tapered shape with a diameter at the principal body surface greater than a diameter at the first body surface, the plurality of empty via apertures arranged in a straight row that extends between a first side of the substrate and a second side of the substrate opposite the first side of the substrate while extending past the electronic component; and
    forming a shield lid interconnect for electrically coupling the shield trace to an EMI shielding structure by filling the empty via apertures that expose the shield trace with an electrically conductive material, where the shield lid interconnect is in direct contact with the package body.

16. The method of claim 15, wherein a distance between adjacent vias of the plurality of vias is small enough to prevent electromagnetic radiation from the electronic component passing sideways through the package body.

17. The method of claim 15, comprising the EMI shielding structure,
    and wherein the EMI shielding structure comprises a shield lid that covers only a portion of the principal body surface.

18. A method of forming an electronic component package, the method comprising:
    mounting an electronic component to a first substrate surface of a substrate;
    directly contacting and enclosing the electronic component and the first substrate surface around the electronic component in a package body, the package body comprising a principal body surface and outer side body surfaces extending from the principal body surface;
    forming a trench extending through the package body between the first substrate surface and the principal body surface, a shield trace on the first substrate surface being exposed through the trench; and
    forming a shield lid interconnect comprising a conductive wall for electrically coupling the shield trace to an EMI shielding structure by, at least in part, filling the trench with an electrically conductive material, where the shield lid interconnect is in direct contact with and passes through the package body, and where the shield lid interconnect is exposed from at least a first of the outer side body surfaces.

19. The method of claim 18, wherein the conductive wall comprises a first planar side that is coplanar with the first of the outer side body surfaces.

20. The method of claim 18, wherein the substrate comprises a second substrate surface opposite the first substrate surface and a plurality of side substrate surfaces that extend between the first and second substrate surfaces, and wherein the conductive wall extends from a first of the side substrate surfaces toward a second of the side substrate surfaces, completely passing the electronic component.

21. The method of claim 19, wherein the shield lid interconnect is exposed from at least a second of the outer side body surfaces.

22. The method of claim 21, wherein the conductive wall comprises a second planar side that is coplanar with the second of the outer side body surfaces.

23. The method of claim 19, comprising the EMI shielding structure, wherein the EMI structure completely covers the first planar side of the conductive wall.

24. The method of claim 18, wherein the trench is wider at the principal body surface than at the first substrate surface.

* * * * *